(12) United States Patent
Terauchi et al.

(10) Patent No.: US 6,222,268 B1
(45) Date of Patent: Apr. 24, 2001

(54) SEMICONDUCTOR DEVICE AND METHOD FOR MANUFACTURING THE SAME

(75) Inventors: Takashi Terauchi; Hiroki Shinkawata, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/215,203

(22) Filed: Dec. 18, 1998

(30) Foreign Application Priority Data

Jul. 7, 1998 (JP) .................................................. 10-191607

(51) Int. Cl.⁷ ...................................................... H01L 23/48
(52) U.S. Cl. ........................... 257/750; 257/774; 257/775
(58) Field of Search ............................. 438/595; 257/773, 257/774, 775, 760, 900

(56) References Cited

U.S. PATENT DOCUMENTS

| | | | |
|---|---|---|---|
| 5,631,484 | * 5/1997 | Tsoi et al. | 257/341 |
| 5,656,853 | * 8/1997 | Ooishi | 257/647 |
| 5,808,365 | * 9/1998 | Mori | 257/775 |
| 5,886,411 | * 3/1999 | Kohyama | 257/774 |
| 5,936,308 | * 8/1999 | Rolfson | 257/774 |
| 6,028,361 | * 2/2000 | Ooishi | 257/774 |
| 6,057,581 | * 5/2000 | Doan | 257/401 |
| 6,087,710 | * 7/2000 | Eimori et al. | 257/649 |
| 6,091,154 | * 7/2000 | Ohkawa | 257/774 |
| 6,130,482 | * 10/2000 | Iio et al. | 257/774 |

* cited by examiner

Primary Examiner—Eddie C. Lee
Assistant Examiner—Lourdes Cruz
(74) Attorney, Agent, or Firm—McDermott, Will & Emery

(57) ABSTRACT

An oxide film 26 is formed on a silicon substrate 10. The oxide film 26 is topped with wiring patterns 34. Top and side portions of the wiring patterns 34 are covered with nitride film top walls 36 and nitride film side walls 38. After an interlayer oxide film 40 is deposited, contact holes 42 are formed through self-alignment. Under the nitride film side walls 38, isotropic etching is carried out to retract side edge surfaces 32 of the oxide film 26 from the wall surface. Contacts 44 are then formed inside the contact holes 42 whose bottom diameter is expanded by the isotropic etching above.

6 Claims, 13 Drawing Sheets

STEP 10

STEP 7, 8

STEP 14

SEMICONDUCTOR DEVICE AND METHOD FOR MANUFACTURING THE SAME

BACKGROUND OF THE INVENTION

1. Field of the Invention

The present invention generally relates to a semiconductor device and a method for manufacturing the same. More particularly, the invention relates to a semiconductor device structured suitably to have contacts self-aligned therein, as well as to a method for manufacturing that semiconductor device.

2. Description of the Background Art

Along with the ever-growing scale in recent years of circuit integration in semiconductor devices has come wiring patterns getting more minuscule than ever before. The trend is making it progressively difficult to ensure the precision of wiring patterns by merely raising the accuracy of masking for photoresist. Illustratively, with memory cells getting finer than ever, boosting the masking accuracy is increasingly liable to fail in having contacts fabricated on such memory devices as DRAMs without short-circuiting their wiring. One known method for producing contacts without developing short-circuits with wiring has recourse to what is known as self-alignment. The conventional self-alignment method will now be described with reference to FIGS. 29 through 31.

Manufacturing contacts conventionally by self-alignment involves first forming an insulating film 12 on a silicon substrate 10 as shown in FIG. 29. On top of the insulating film 12 are formed silicon wiring 14 and nitride film top walls 16.

As shown in FIG. 30, nitride film side walls 18 to protect the silicon wiring 14 are formed laterally onto the silicon wiring 14 and the nitride film top walls 16. At this stage, the silicon wiring 14 is covered with the nitride films 16 and 18.

An interlayer oxide film 20 (see FIG. 31) is deposited all over the silicon substrate 10, being masked at suitable portions by photoresist and being subjected to an oxide film etching process. This produces contact holes 22. The oxide film etching process is done in a manner that causes removing the oxide film 20 at a sufficient selective ratio to nitride film. That is, the nitride film top walls 16 and nitride film side walls 18 remain virtually undamaged by the etching.

If the portions not masked by photoresist are sufficiently wide relative to the pitch of the silicon wiring 14, not only the interlayer oxide film 20 but also the nitride films 16 and 18 would be involved in an subjected area of the etching in the midst of the process. In this case, the nitride films 16 and 18 act as stoppers against the oxide film etching whose progress is impeded thereby. This manufactures contact holes 22 opened to the surface of the silicon substrate 10 without exposing the silicon wiring 14, as shown in FIG. 31.

A silicon film is then deposited in the contact holes 22 and formed to a desired shape. As a result, contacts 24 that conduct to the silicon substrate 10 are produced as depicted in FIG. 31. As described, the self-alignment method involves making contact holes through etching between wiring patterns while protecting these patterns with stopper films. The above method enables to manufacture desired contacts in a stable manner regardless of some errors in alignment between photoresist openings and wiring patterns.

According to the conventional method, however, part of the spaces between the silicon wires 14 are inevitably occupied by the nitride film side walls 18. This reduces the widths of the contacts 24 formed between the silicon wires 14, which makes it difficult to diminish the contact resistance between the contacts 24 and the silicon substrate 10. In other words, a major problem with the conventional self-alignment method, despite its advantage in forming the contacts 24 stably, is a tendency to increase the contact resistance between the contacts 24 and the silicon substrate.

SUMMARY OF THE INVENTION

The present invention has been conceived to solve the previously-mentioned problems, and a general object of the present invention is to provide a novel and useful semiconductor device and a method for manufacturing the same.

A more specific object of the present invention is to provide a semiconductor device structured suitably to form contacts stably therein and to minimize contact resistance.

The above object of the present invention is achieved by a semiconductor device. The semiconductor device includes wiring patterns; nitride film top walls formed on top of the wiring patterns; nitride film side walls formed laterally to each of the wiring patterns; contacts which are each formed interposingly between the wiring patterns and which are isolated from the wiring patterns by the nitride film top walls and the nitride film side walls; and an oxide film formed under the wiring patterns. A bottom of the oxide film is lower than that of the nitride film side walls. A side edge surface of each of the oxide film is retracted away from a frontal edge of the corresponding nitride film side wall into the corresponding wiring pattern. Each of the contact extends into beneath of the corresponding nitride film side wall.

A further object of the present invention is to provide a method for manufacturing the semiconductor device targeted as the first object.

The above objects of the present invention is achieved by a method for manufacturing a semiconductor device. The method includes the steps for forming an oxide film on a semiconductor substrate; forming a wiring layer on the oxide film; forming a nitride film top wall layer on the wiring layer; forming wiring patterns and nitride film top walls by shaping the wiring layer and the nitride film top wall layer into suitable wiring pattern shape; forming nitride film side walls laterally to the wiring patterns and to the nitride film top walls; after depositing an interlayer oxide film, forming contact holes interposingly between the wiring patterns so that the nitride film top walls and the nitride film side walls will remain and that a side edge surface of the oxide film will be retracted from a frontal edge of the corresponding nitride film side wall into the corresponding wiring pattern; and forming contacts inside the contact holes.

Other objects and further features of the present invention will be apparent from the following detailed description when read in conjunction with the accompanying drawings.

DESCRIPTION OF THE PREFERRED EMBODIMENTS

Figure 1:
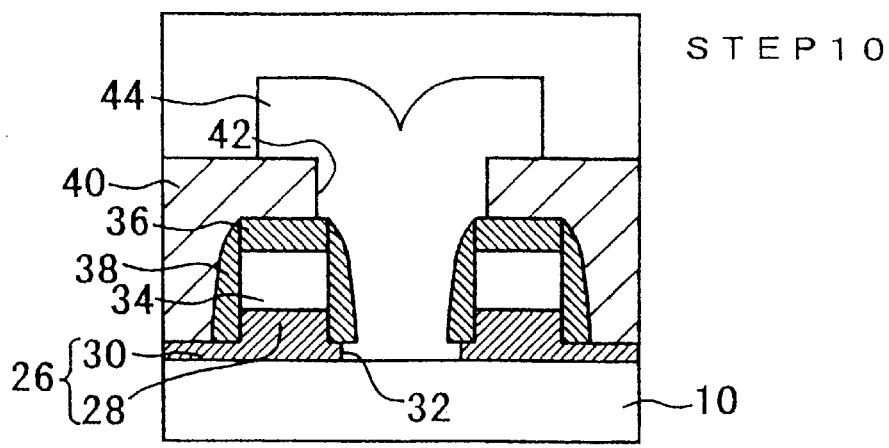
FIG. 1 is a cross-sectional view showing a principal part of a semiconductor device practiced as a first embodiment of the present invention.

In the following, principles and embodiments of the present invention will be described with reference to the accompanying drawings.

First Embodiment

A first embodiment of this invention will now be described with reference to FIGS. 1 through 7. Throughout the drawings, the same reference numerals designate the same or corresponding parts, and repetition of their descriptions will be omitted.

FIG. 1 is a cross-sectional view of a semiconductor device practiced as the first embodiment of this invention. As shown in FIG. 1, the inventive semiconductor device comprises a silicon substrate 10 on which an oxide film 26 is formed.

The oxide film 26 has convex portions 28 and flat portions 30. The top of the convex portions 28 are more elevated than that of the flat portions 30. The oxide film 26 have side edge surfaces 32 positioned facing one another. Between two opposed side edge surfaces 32 is a predetermined interval.

The convex portions 28 of the oxide film 26 are topped with wiring patterns 34. On top of the wiring patterns 34 are nitride film top walls 36. The wiring patterns 34 and the nitride film top walls 36 are provided laterally with nitride film side walls 38. The side edge surfaces 32 of the oxide films 26 are formed in a retracted fashion into the wiring patterns 34 from the surface of the nitride film side walls 38.

The oxide film 26, nitride film side walls 38 and nitride film top walls 36 are covered with an interlayer oxide film 40. Formed in the interlayer oxide film 40 are contact holes 42 that are opened to the surface of the silicon substrate 10. At the bottom of the nitride film side walls 38, the contact holes 42 protrude toward the side surfaces of the oxide films 26.

Inside the contact holes 42, contacts 44 are formed by the CVD (chemical vapor deposition) method. Manufacturing the contacts 44 in this manner allows them to penetrate into minute corners of the contact holes 42, i.e., into gaps between the lower portions of the nitride film side walls 38 and the silicon substrate 10.

Figure 2:
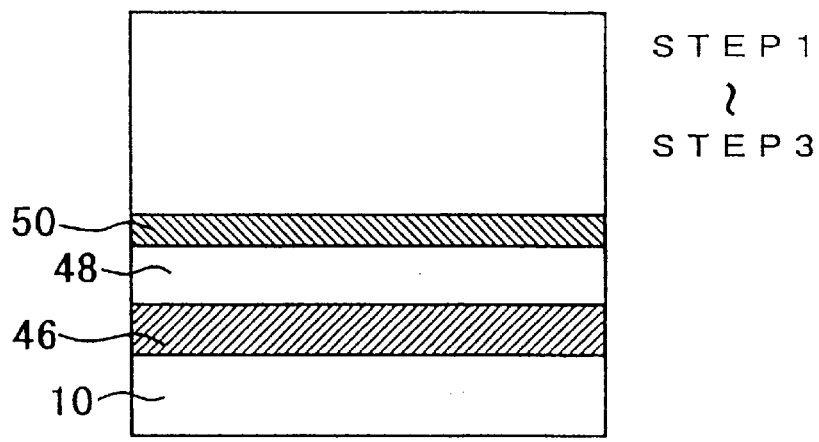
FIGS. 2 thorough 7 are cross sectional views for explaining a method for manufacturing the semiconductor device practiced as the first embodiment of the present.

A preferred method for manufacturing the semiconductor device of the first embodiment will now be described. In manufacturing the inventive semiconductor device, an oxide film layer 46 is first formed over the silicon substrate 10 as shown in FIG. 2 (step 1).

The oxide film layer 46 is furnished by means of low or normal pressure CVD processes depositing undoped silicon oxide film of 50 nm to 100 nm thick.

A wiring layer 48 is then formed on the oxide film layer 46 (step 2).

The wiring layer 48 is formed by one of four kinds of materials: (1) polycrystal silicon or amorphous silicon (doped with P, As, etc.) deposited through CVD; (2) a silicide film consisting of high melting point metal such as Ti, TiN or W; (3) a film made of these films; or (4) a conductive metal film such as W or AL. The wiring layer 48 has a film thickness of 50 nm to 200 nm.

A nitride film top wall layer 50 is formed on the wiring layer 48 (step 3).

The top wall layer 50 is produced by use of a silicon nitride film or a nitride oxide film deposited through CVD or by depositing a layer of such films. The top wall layer 50 has a film thickness of 20 nm to 100 nm.

When the steps above have been completed, the nitride film top wall layer 50, wiring layer 48 and oxide film layer 46 are subjected to dry etching such as RIE (reactive ion etching). This produces desired shapes of wiring patterns (step 4).

Figure 3:
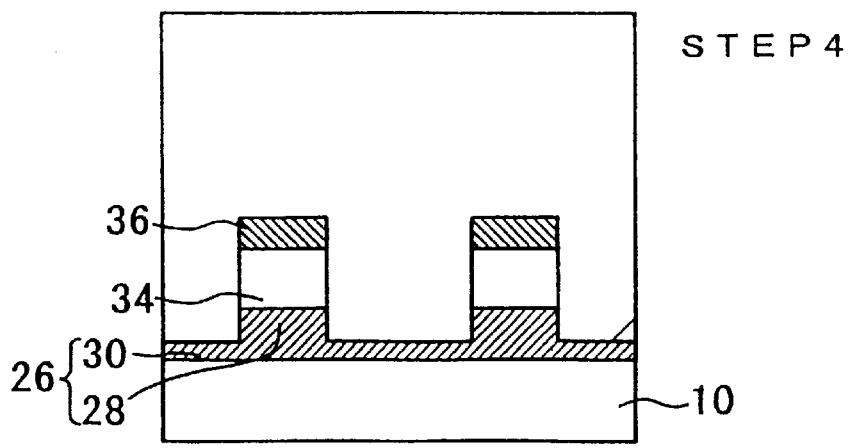

The etching process is terminated when the surface of the oxide film layer 46 is removed by a predetermined film thickness. The etching forms an oxide film 26 having convex portions 28 and flat portions 30, wiring patterns 34, and nitride film top walls 36, as shown in FIG. 3.

Figure 4:
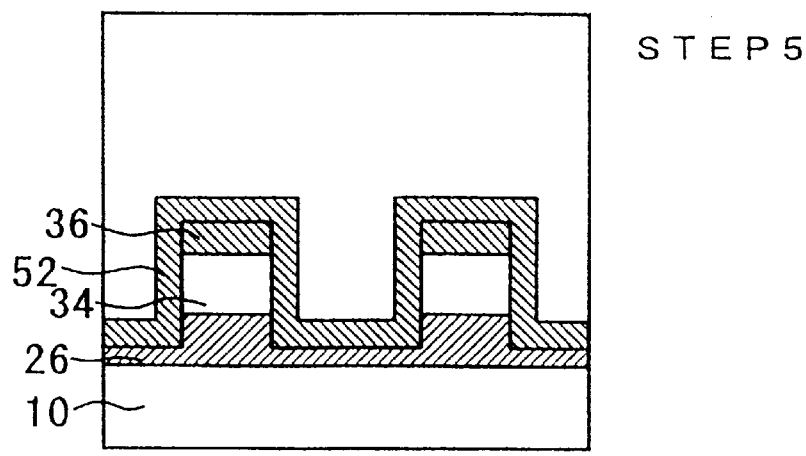

With step 4 carried out, a nitride film layer 52 is formed all over the silicon substrate 10, as indicated in FIG. 4 (step 5).

As with the nitride film top wall layer 50 mentioned above, the nitride film layer 52 is formed by a CVD process depositing a silicon nitride film or a nitride oxide film 20 nm to 100 nm thick, or by use of a layer of such films.

Figure 5:
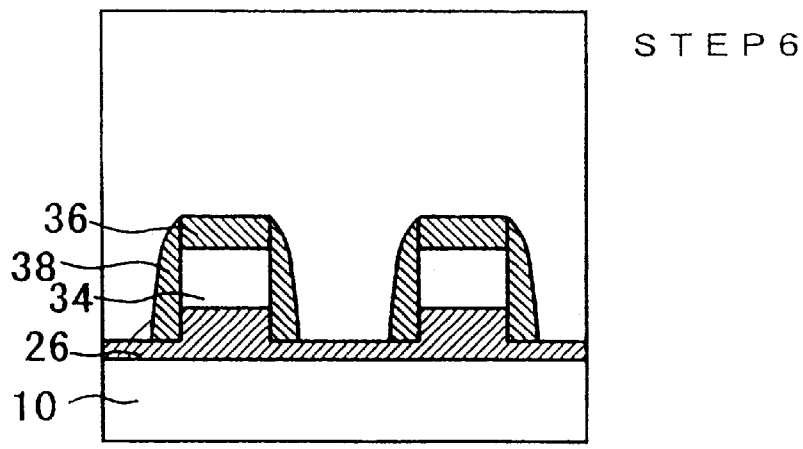

After the nitride film layer 52 is formed, the entire surface of the nitride film layer 52 is subjected to an etch-back process consisting of dry etching such as RIE. This forms the nitride film side walls 38 as illustrated in FIG. 5 (step 6).

The etch-back process is carried out so that nitride film is removed at a sufficient selective ratio to oxide films. That is, the oxide film 26 remains virtually untouched while the nitride film layer 52 is being etched back.

The interlayer oxide film 40 (see FIG. 6) is then deposited all over the silicon substrate 10 (step 7).

Figure 6:
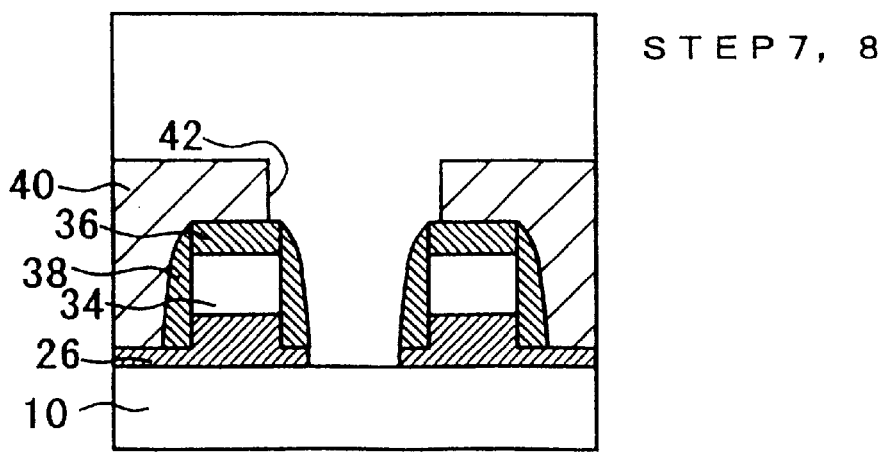

The formation of the interlayer oxide film 40 is followed by a masking process involving photoresist. Thereafter, dry etching such as RIE is conducted to make the contact holes 42 as shown in FIG. 6 (step 8).

In the case of masking with photoresist, unmasked portions (called etching regions hereunder) are fabricated to be wide relative to the pitch of the wires 34. More specifically, the etching regions are made so as to have overlapping regions with the nitride film top walls 36. The interlayer oxide film 40 is etched in a manner where the oxide film 40 is removed at a sufficient selective ratio to the nitride films 36 and 38. These processes allow the contact holes 42 to be self-aligned and opened to the surface of the silicon substrate 10 in a stable fashion.

With the above steps completed, a wet type etching process (such as HF) is carried out to etch isotropically the oxide film 26 inside the contact holes 42 (step 9).

During the process, the oxide film 26 is etched at a sufficient selective ratio to the nitride films 36 and 38. In that case, the nitride films 36 and 38 act as stoppers against etching. The steps so far cause the bottom of the contact holes 42 to intrude into the bottom of the nitride film side walls 38, thereby widening the diameter of each contact hole at its bottom as shown in FIG. 7.

Figure 7:
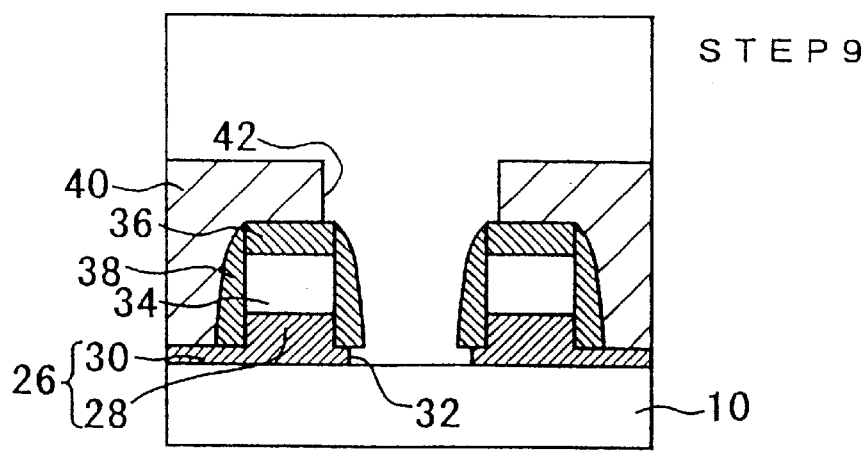

With the first embodiment, as shown in FIG. 7, the top of the convex portions 28 of the oxide film 26 is higher than the top of the flat portions 30, i.e., higher than the bottom of the nitride film side walls 38. Furthermore, the etching of the oxide film 26 is allowed to end where the side edges 32 of the oxide film 28 are located under the nitride film side walls 38. Accordingly, the inventive method reliably prevents the wiring patterns 34 from getting exposed to the contact holes 42 regardless that the oxide film 26 is etched at the lower portions of the nitride film side walls 38.

After the contact holes 42 are fabricated, the contacts 44 are formed therein (step 10).

The contacts 44 are made first by a CVD process depositing polycrystal silicon or amorphous silicon (doped with P, As, etc.) to a film thickness of 50 nm to 200 nm and then by shaping the deposited material as required. In the semiconductor device of the first embodiment, the contact holes 42 penetrate into the bottom of the nitride film side walls 38. This structure allows the contacts 44 to secure large areas at their bottom. That is, the manufacturing method is capable of ensuring the benefits of the conventional method of manufacture by self-alignment while manufacturing as the first embodiment a semiconductor device suitably structured to reduce the contact resistance between the contacts 44 and the silicon substrate 10.

Second Embodiment

A second embodiment of the invention will now be described with reference to FIGS. 8 through 14. In these figures, those parts with their counterparts already shown in FIGS. 1 through 7 are given the same reference numerals, and descriptions of such parts are omitted partially or entirely where they are repetitive.

Figure 8:
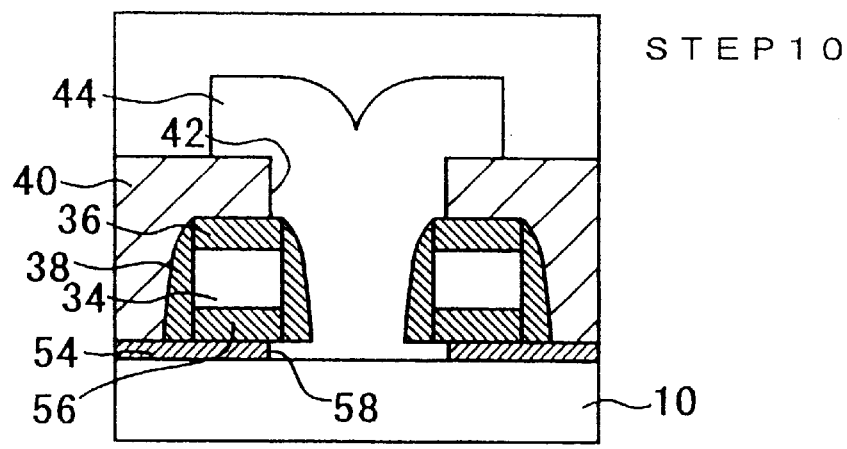
FIG. 8 is a cross-sectional view showing a principal part of a semiconductor device practiced as a second embodiment of the present invention.

FIG. 8 is a cross-sectional view of a semiconductor device practiced as the second embodiment of the invention. A first characteristic of the second embodiment is the presence of both an oxide film 54 deposited on the silicon substrate 10 and nitride film bottom walls 56 interposed between the oxide film 54 and the wiring patterns 34. A second characteristic of this semiconductor device lies in the fact that side edge surfaces 58 of the oxide film 54 are each retracted from the back side of each nitride film side wall 38 toward the center of the corresponding wiring pattern 34, i.e., each side edge surface 58 is located under the corresponding nitride film bottom wall 56.

As shown in FIG. 8, the nitride film bottom walls 56 are each formed between the nitride film side walls 38. This feature, in the semiconductor device of the second embodiment, enables the wiring patterns 34 to be protected on all sides by the nitride films 36, 38 and 56. The structure prevents the wiring patterns 34 from getting exposed during an etching process that has a sufficient selective ratio for an oxide film to a nitride film. This in turn allows the second embodiment to have each side edge surface 58 of the oxide film 54 retracted to the bottom of the corresponding nitride film bottom wall 56, as described.

The greater the bottom area of each contact 44, i.e., the greater the extent to which each side edge 58 of the oxide film 54 is retracted into the corresponding wiring pattern 34, the lower the contact resistance between the contacts 44 and the silicon substrate 10. This means that the second embodiment surpasses the first embodiment in reducing the contact resistance between the contacts 44 and the silicon substrate 10. In this manner, the semiconductor device of the second embodiment prevents reliably any short-circuits between the wiring patterns 34 and the contacts 44 while obtaining a sufficiently low level of contact resistance between the contacts 44 and the silicon substrate 10.

A preferred method for manufacturing the semiconductor device of the second embodiment is described below. In the description below, steps 1 through 10 with the second embodiment are the same as those with the first embodiment.

Figure 9:
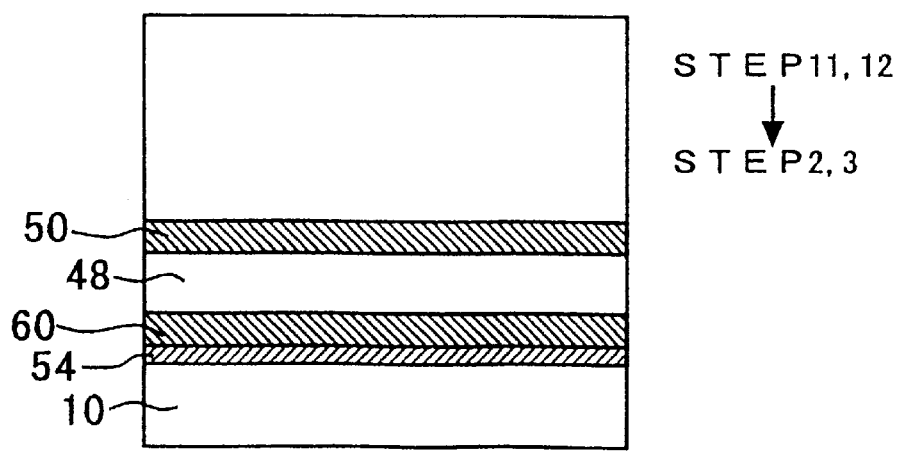
FIGS. 9 thorough 14 are cross sectional views for explaining a method for manufacturing the semiconductor device practiced as the second embodiment of the present invention.

In manufacturing the second embodiment, the oxide film 54 is formed on the silicon substrate 10 as shown in FIG. 9 (step 11).

The oxide film 54 is furnished by means of low or normal pressure CVD processes depositing undoped silicon oxide films to a film thickness of 50 nm to 100 nm.

The oxide film 54 is topped with a nitride film bottom wall layer 60 (step 12).

The nitride film bottom wall layer 60 is furnished by a CVD process depositing a silicon nitride film, a nitride oxide film or a film made of such films to a film thickness of 20 nm to 100 nm. The nitride film bottom wall layer 60 is topped with the wiring layer 48 and the nitride film top wall layer 50, in that order (steps 2 and 3).

Figure 10:
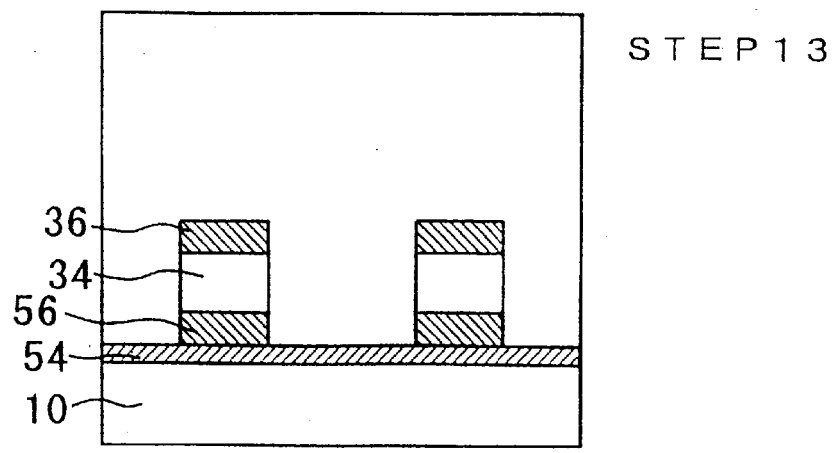
Figure 11:
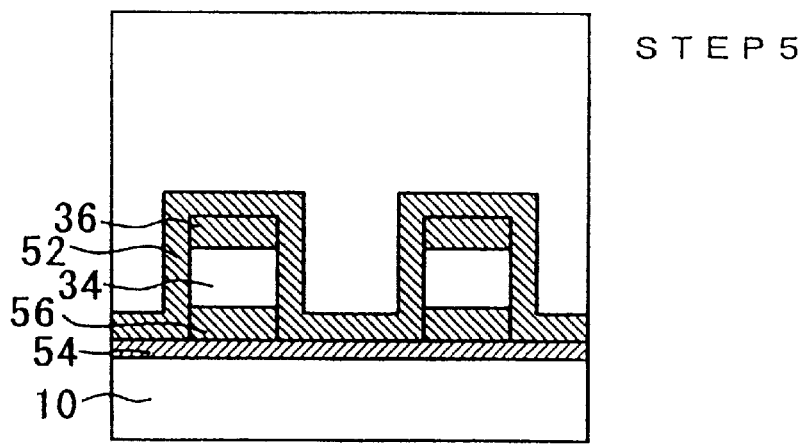
Figure 12:
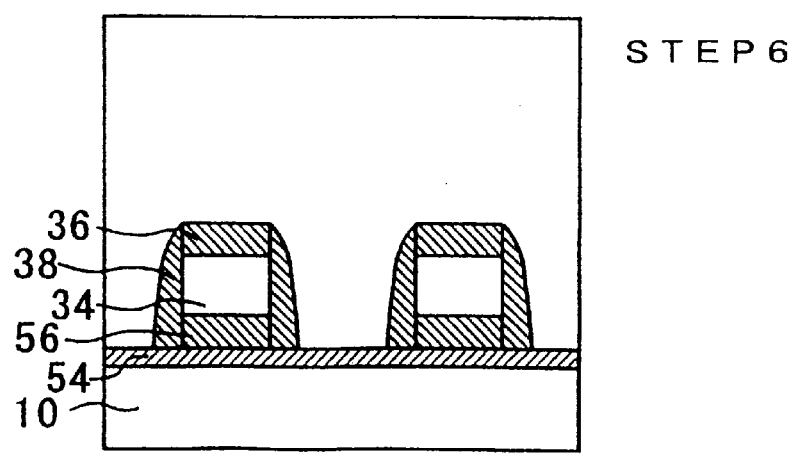
Figure 13:
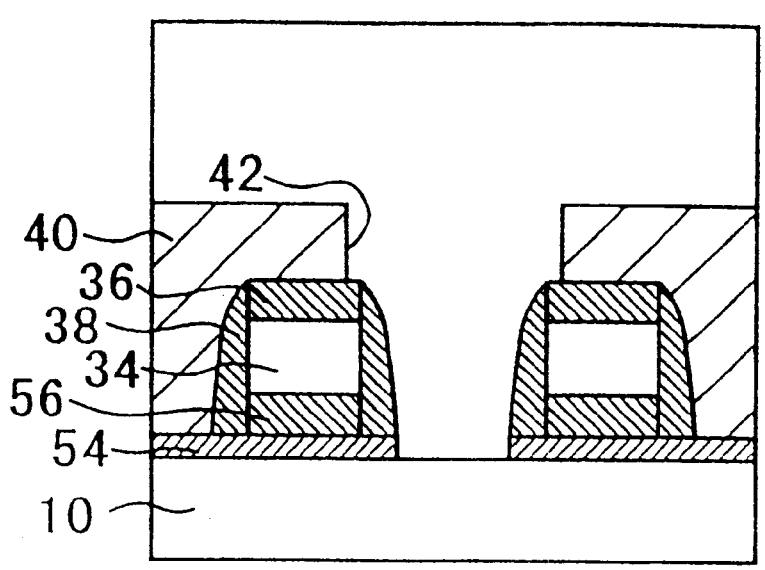

After the steps above are completed, the nitride film top wall layer 50, wiring layer 48 and nitride film bottom wall layer 60 are subjected to dry etching such as RIE. This forms desired shapes of wiring patterns as shown in FIG. 10 (step 13).

As is the case with the first embodiment, step 13 is followed by the process of forming the nitride film layer 52 (FIG. 11; step 5), by the process of forming the nitride film side walls 38 (FIG. 12; step 6) and by the process of forming the contact holes 42 (FIG. 13; steps 7, 8), in that order.

Figure 14:
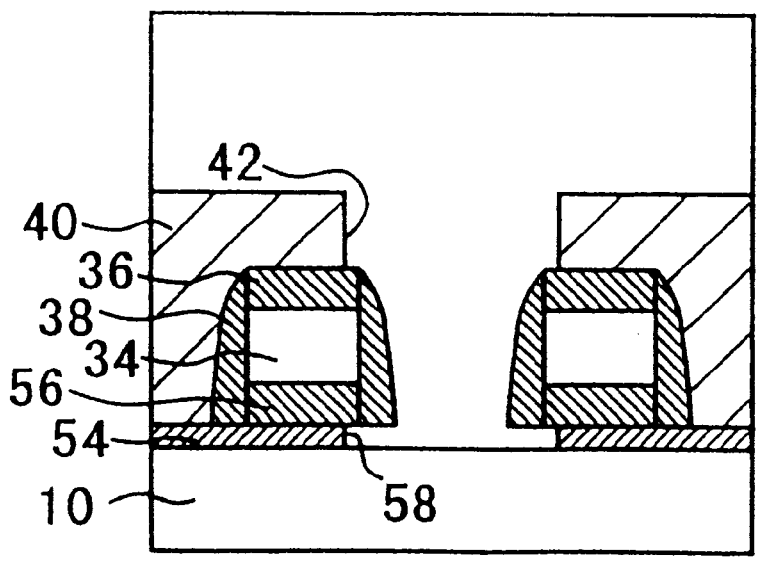

When the above steps are completed, a wet type etching process (such as HF) is carried out to etch isotropically the oxide film 26 as in the case of the first embodiment (FIG. 14; step 14).

During the etching process of step 14 with the second embodiment, the oxide film 26 is etched at a sufficient selective ratio to the nitride films 36, 38 and 56. Furthermore, the etching continues until the side edge surfaces 58 of the oxide film 54 retracted into beneath the nitride film bottom walls 56.

According to the preferred method above for manufacture, the nitride films 36, 38 and 56 are furnished to serve as stoppers against etching. This arrangement prevents reliably the wiring patterns 34 from getting exposed while enabling the bottom of the contact holes 42 to penetrate appreciably under the nitride film side walls 38. Thereafter, as with the first embodiment, the contacts 44 are formed inside the contact holes 42 (FIG. 8; step 10).

The preferred method above for the second embodiment prevents reliably any short-circuits between the wiring patterns 34 and the contacts 44 while ensuring a more extensive area at the bottom of each contact 44 than in the case of the first embodiment. This makes it possible to manufacture stably the semiconductor device with reduced contact resistance between the contacts 44 and the silicon substrate 10.

Third Embodiment

A third embodiment of this invention will now be described with reference to FIGS. 15 through 18. In these figures, those parts with their counterparts already shown in FIGS. 1 through 14 are given the same reference numerals, and descriptions of such parts are omitted partially or entirely where they are repetitive.

Figure 15:
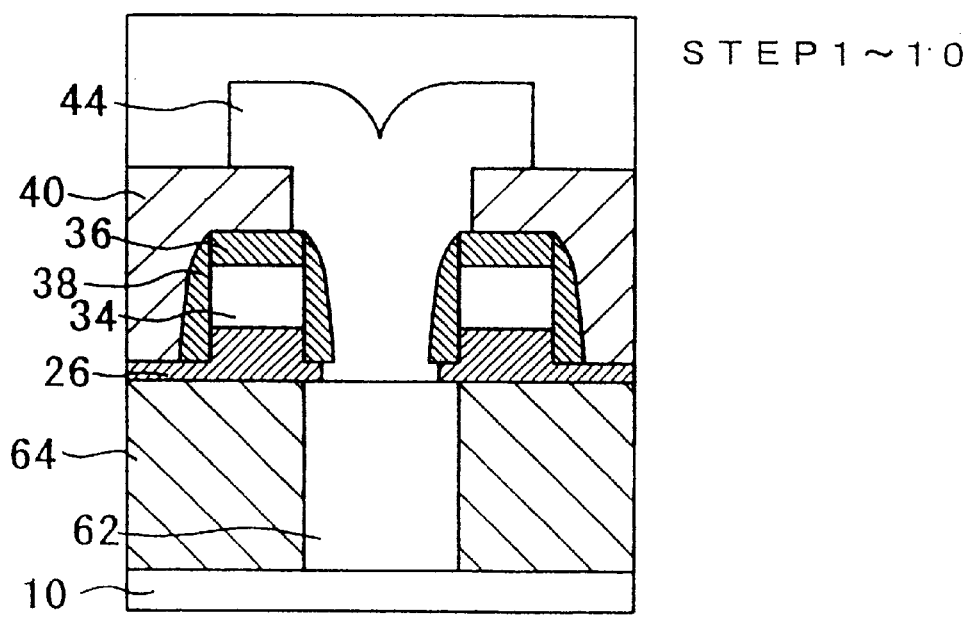
FIG. 15 is a cross-sectional view showing a principal part of a semiconductor device practiced as a third embodiment of the present invention.

FIG. 15 is a cross-sectional view of a semiconductor device practiced as the third embodiment of the invention. The semiconductor device of the third embodiment has the same structure as the first embodiment except that the contacts 44 are connected to the silicon substrate 10 by means of plugs 62.

With the third embodiment, the plugs 62 and an interlayer oxide film 64 are formed on the silicon substrate 10. The plugs 62 are formed by one of four kinds of materials: (1) polycrystal silicon or amorphous silicon (doped with P, As, etc.) deposited through CVD; (2) a silicide film consisting of high melting point metal such as Ti, TiN or W; (3) a film made of these films; or (4) a conductive metal film such as W or Al. The interlayer oxide film 64 is furnished by means of low or normal pressure CVD processes depositing undoped or phosphorus- or boron-doped silicon oxides to a film thickness of 100 nm to 1,000 nm.

According to the inventive structure of the third embodiment, despite the plugs 62 interposed between the contacts 44 and the silicon substrate 10, the contact resistance of the contacts 44 is as effectively inhibited as with a case of the first embodiment in which the contacts 44 are directly connected to the silicon substrate 10.

Figure 16:
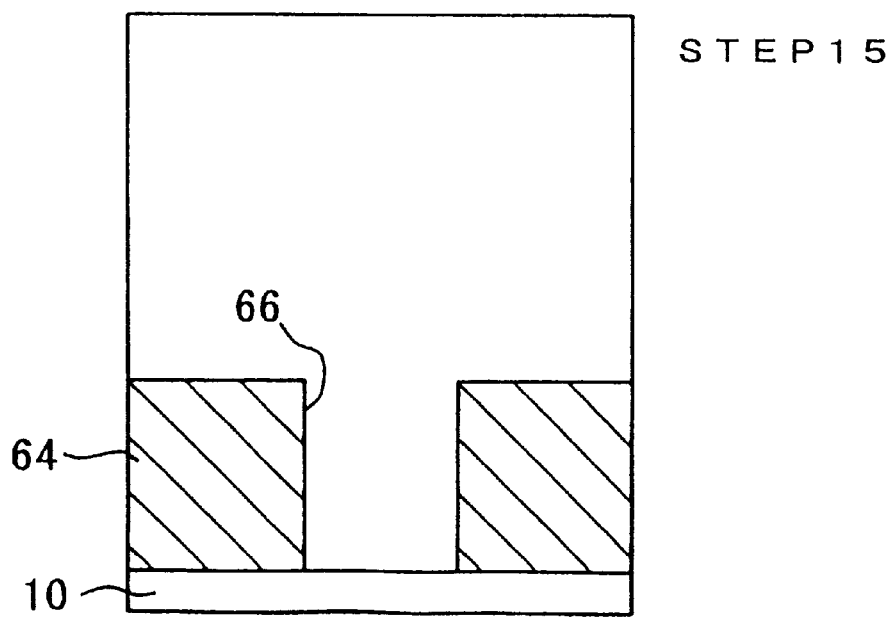
FIGS. 16 thorough 18 are cross sectional views for explaining a method for manufacturing the semiconductor device practiced as the third embodiment of the present invention.
Figure 17:
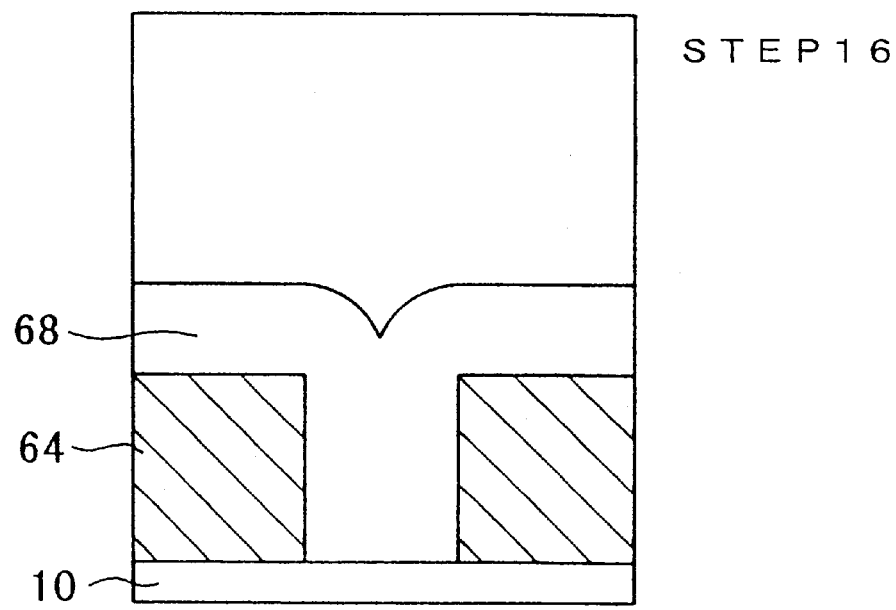

A preferred method for manufacturing the semiconductor device of the third embodiment is described below. According to this method, the interlayer oxide film 64 is first deposited on the silicon substrate 10. Then dry etching such as RIE is carried out to form suitable contact holes 66 (FIG. 16; step 15).

Figure 18:
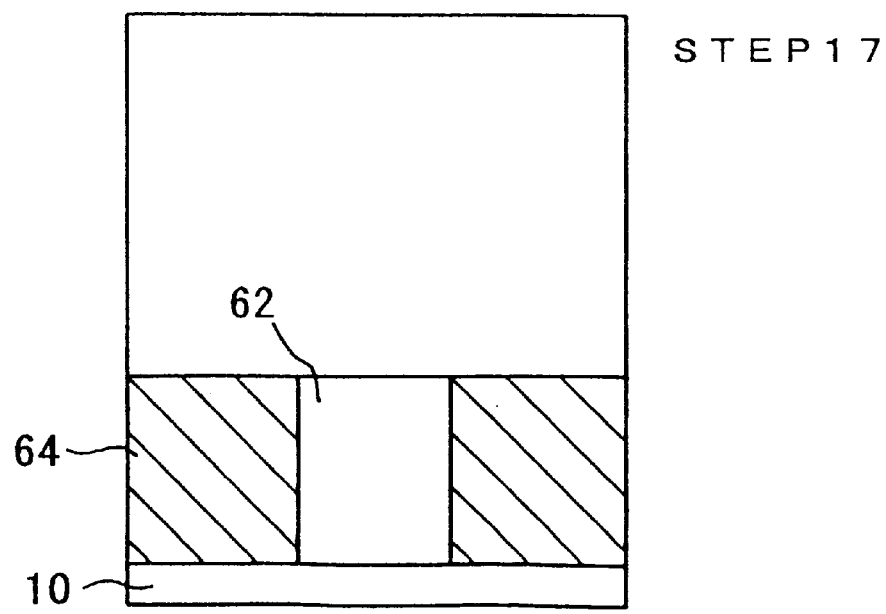

After a silicon film 68 is deposited all over the silicon substrate 10 (FIG. 17; step 16), dry etching such as RIE or an etch-back process using a polisher for CMP is carried out to form the plugs 62 (FIG. 18; step 17). Thereafter, steps 1 through 10 are performed in the same manner as with the first embodiment, whereby the semiconductor device of the third embodiment is manufactured (FIG. 15).

Fourth Embodiment

Figure 19:
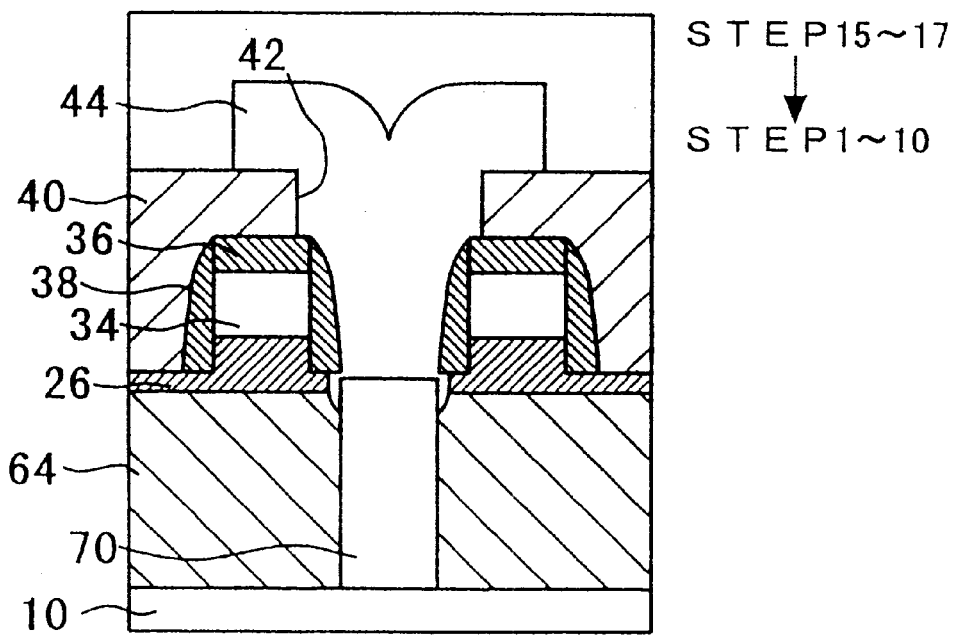
FIG. 19 is a cross-sectional view showing a principal part of a semiconductor device practiced as a forth embodiment of the present invention.

A fourth embodiment of this invention will now be described with reference to FIG. 19. In FIG. 19, those parts with their counterparts already shown in FIGS. 1 through 18 are given the same reference numerals, and descriptions of such parts are omitted partially or entirely where they are repetitive.

FIG. 19 is a cross-sectional view of a semiconductor device practiced as the fourth embodiment of the invention. The semiconductor device of the fourth embodiment has the same structure as the third embodiment except that between each contact 44 and the silicon substrate 10 is a plug 70 smaller in diameter than the contact 44.

The semiconductor device of the fourth embodiment may be manufactured by the same method as that for producing the third embodiment except that the plugs 70 must be made smaller in diameter. If the diameter of each plug 70 is smaller than the bottom region of the corresponding contact 44, i.e., if the plug 70 is smaller in diameter than the opening of the contact hole 42, during the isotopic etching of the interlayer oxide film 26 (FIG. 7; step 9), the interlayer oxide film 64 is also eliminated from around the plug 70. Thus where the plugs 70 are smaller in diameter than the contacts 44, the structure shown in FIG. 19 is manufactured by means of the manufacturing method described above.

In the structure of FIG. 19, the bottom of each contact 44 is in contact with the top of the corresponding plug 70 while the plug 70 is laterally surrounded near its top by the contact 44. As a result, the contact resistance between the contacts 44 and the plugs 70 is brought to a sufficient low level despite the fact that each plug 70 has an appreciably small diameter. Thus produced, the semiconductor device of the fourth embodiment is capable of reducing the contact resistance of the contacts 44 as effectively as the third embodiment.

Fifth Embodiment

A fifth embodiment of the invention will now be described with reference to FIGS. 20 through 23. In these figures, those parts with their counterparts already shown in FIGS. 1 through 19 are given the same reference numerals, and descriptions of such parts are omitted partially or entirely where they are repetitive.

Figure 20:
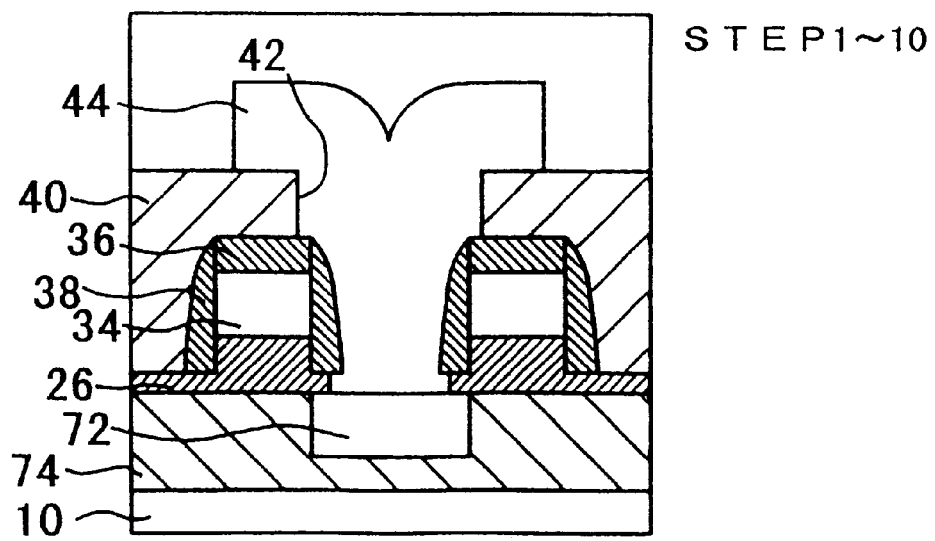
FIG. 20 is a cross-sectional view showing a principal part of a semiconductor device practiced as a fifth embodiment of the present invention.

FIG. 20 is a cross-sectional view of a semiconductor device practiced as the fifth embodiment of the invention. The semiconductor device of the fifth embodiment has the same structure as the first embodiment except that the contacts 44 are directly connected to wiring 72.

In the fifth embodiment, the wiring 72 and an interlayer oxide film 74 are formed on the silicon substrate 10. This structure, with the contacts 44 directly connected to the wiring 72, reduces contact resistance of the contacts 44 as effectively as the first embodiment wherein the contacts 44 are connected directly to the silicon substrate 10.

A preferred method for manufacturing the semiconductor of the fifth embodiment is briefly described below.

Figure 21:
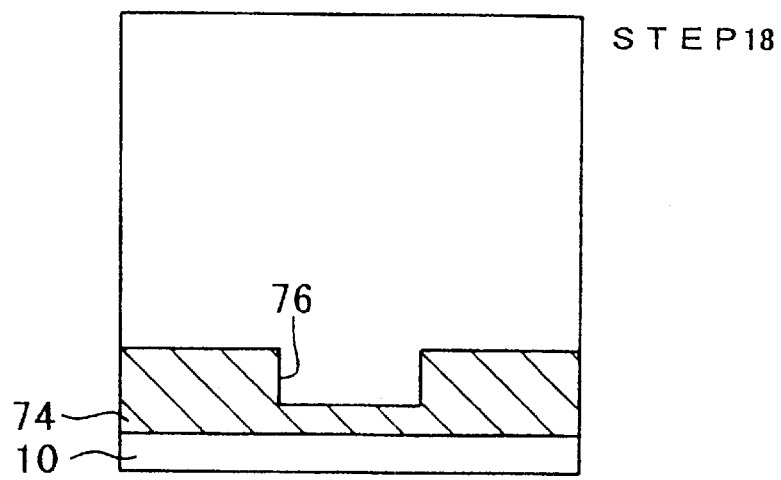
FIGS. 21 thorough 23 are cross sectional views for explaining a method for manufacturing the semiconductor device practiced as the fifth embodiment of the present invention.
Figure 22:
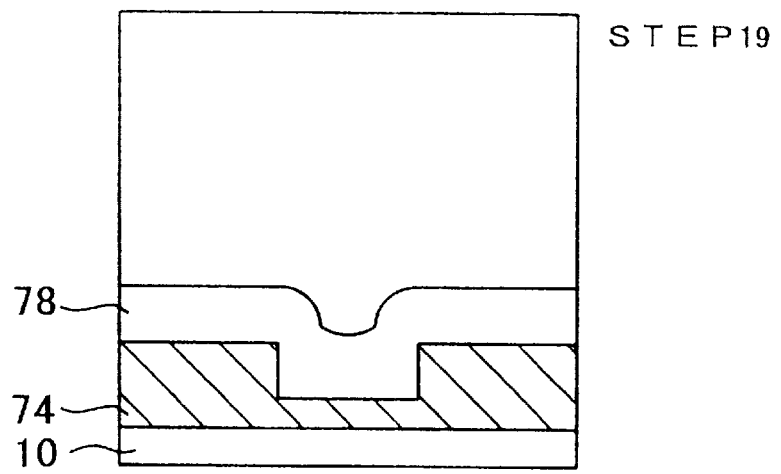

In manufacturing the fifth embodiment, the interlayer oxide film 74 is first deposited on the silicon substrate 10. Then dry etching such as RIE is carried out to form suitable grooves 76 (FIG. 21; step 18).

Figure 23:
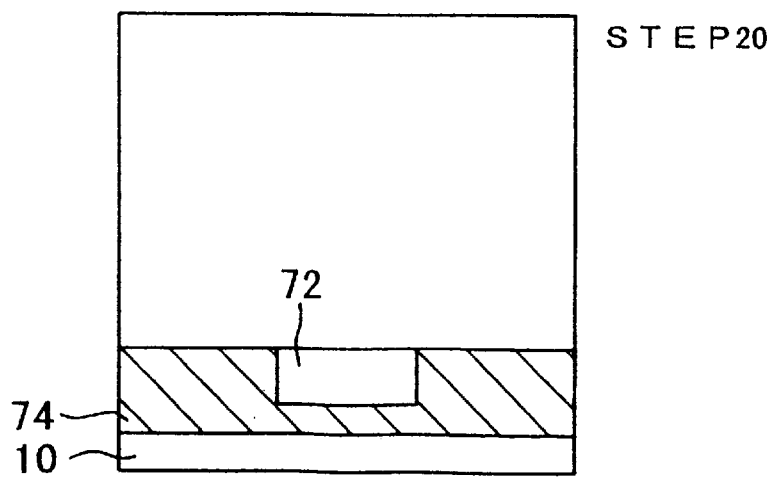

After a silicon film 78 is deposited all over the silicon substrate 10 (FIG. 22; step 19), the wiring 72 is formed by dry etching such as RIE, CMP or by an etch-back process involving a ploisher such as Damachine (FIG. 23; step 20). Thereafter, steps 1 through 10 are performed in the same manner as with the first embodiment, whereby the semiconductor device of the fifth embodiment is fabricated (FIG. 20).

Sixth Embodiment

Figure 24:
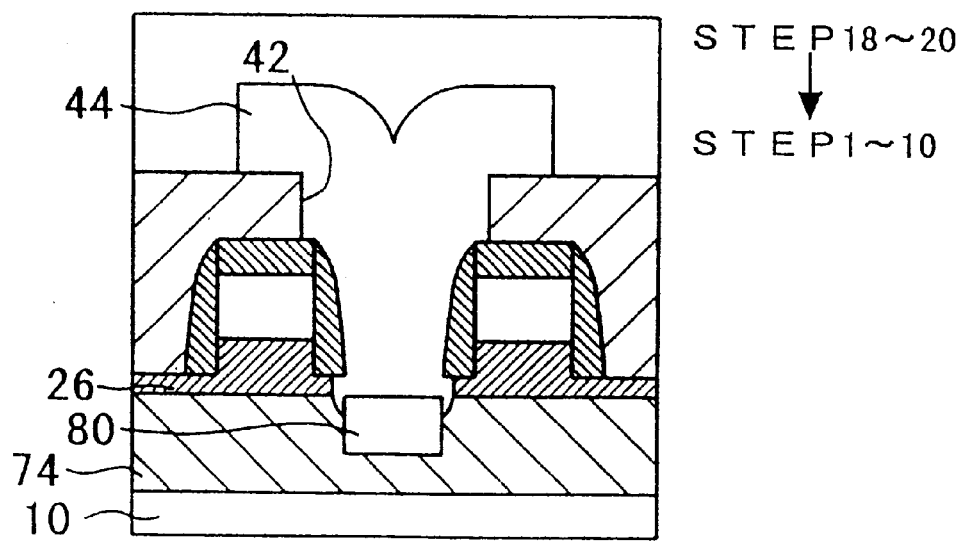
FIG. 24 is a cross-sectional view showing a principal part of a semiconductor device practiced as a sixth embodiment of the present invention.

A sixth embodiment of this invention will now be described with reference to FIG. 24. In FIG. 24, those parts with their counterparts already shown in FIGS. 1 through 23 are given the same reference numerals, and descriptions of such parts are omitted partially or entirely where they are repetitive.

FIG. 24 is a cross-sectional view of a semiconductor device practiced as the sixth embodiment of the invention. The semiconductor device of the sixth embodiment has the same structure as the fifth embodiment except that there exists between each contact 44 and the silicon substrate 10 wiring 80 that is smaller in width than the diameter of the contact 44.

The semiconductor device of the sixth embodiment is manufactured in the same manner as the fifth embodiment except that the wiring 80 is made thinner. If the width of each wiring 80 is smaller than the bottom diameter of the corresponding contact 44, i.e., if the width of the wiring 80 is smaller than the diameter of the opening of the corresponding contact hole 42, during an isotropic etching to remove the oxide film 26 (see FIG. 7; step 9), the interlayer oxide film 74 is also eliminated from around the wiring 80. Thus where the width of the wiring 80 is smaller than the diameter of each contact 44, the structure shown in FIG. 24 is manufactured by means of this preferred method.

In the structure of FIG. 24, the bottom of each contact 44 is in contact with the top of the corresponding wiring 80 while the wiring 80 is laterally surrounded near its top by the contact 44. Accordingly, the structure shown in FIG. 24 enables the contact resistance between the contacts 44 and the wiring 80 to be brought to a sufficiently low level despite the fact that each wiring 80 has an appreciably small width. Thus produced, the semiconductor device of the sixth embodiment is capable of reducing the contact resistance of the contacts 44 as effectively as the fifth embodiment.

Seventh Embodiment

Figure 25:
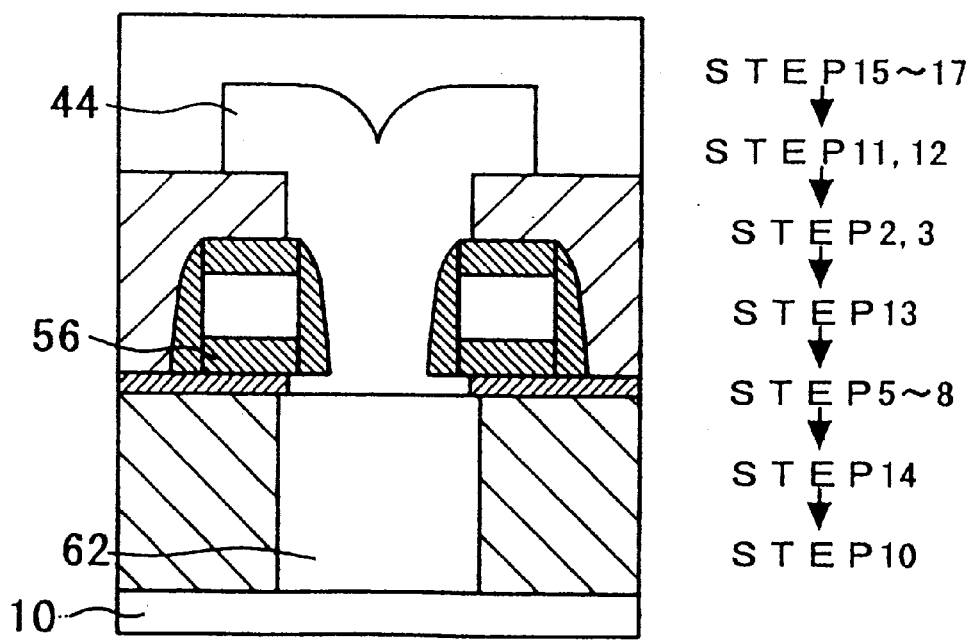
FIG. 25 is a cross-sectional view showing a principal part of a semiconductor device practiced as a seventh embodiment of the present invention.

A seventh embodiment of this invention will now be described with reference to FIG. 25. In FIG. 25, those parts with their counterparts already shown in FIGS. 1 through 24 are given the same reference numerals, and descriptions of such parts are omitted partially or entirely where they are repetitive.

FIG. 25 is a cross-sectional view of a semiconductor device practiced as the seventh embodiment of the invention. As with the third embodiment (see FIG. 15), the semiconductor device of the seventh embodiment has the plugs 62 interposed between the contacts 44 and the silicon substrate 10. Except for the presence of the plugs 62, the semiconductor device of the seventh embodiment has the same structure as the second embodiment (see FIG. 8).

As mentioned previously, the structure of the second embodiment has a contacts including the bottom regions extending into beneath of the nitride film bottom walls 56. This means that semiconductor device of the seventh embodiment may have a still lower level of contact resistance between the contacts 44 and the plugs 62 than the third embodiment. The seventh embodiment may be manufactured by carrying out the above-described steps 15 through 17, 11, 12, 2, 3, 13, 5 through 8, 14, and 10, in that order.

Eighth Embodiment

Figure 26:
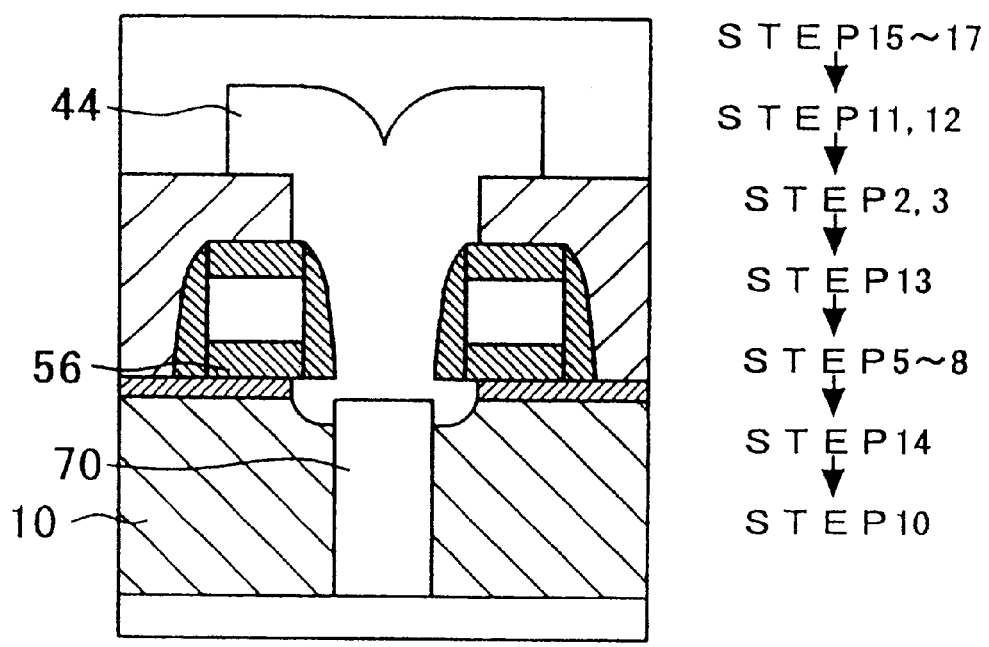
FIG. 26 is a cross-sectional view showing a principal part of a semiconductor device practiced as a eighth embodiment of the present invention.

An eighth embodiment of this invention will now be described with reference to FIG. 26. In FIG. 26, those parts with their counterparts already shown in FIGS. 1 through 25 are given the same reference numerals, and descriptions of such parts are omitted partially or entirely where they are repetitive.

FIG. 26 is a cross-sectional view of a semiconductor device practiced as the eighth embodiment of the invention. As with the fourth embodiment (see FIG. 19), the semiconductor device of the eighth embodiment has the plugs 70 of a small diameter interposed between the contacts 44 and the silicon substrate 10. Except for the presence of the plugs 70, the semiconductor device of the eighth embodiment has the same structure as the second embodiment (see FIG. 8).

The above structure of the eighth embodiment may have the bottom regions of the contacts 44 extending into beneath of the nitride film bottom walls 56. This means that semiconductor device of the eighth embodiment may have a still lower level of contact resistance between the contacts 44 and the plugs 70 than the fourth embodiment. Except for the need to reduce the plug width, the semiconductor device of the eighth embodiment may be manufactured by the same steps as the seventh embodiment.

Ninth Embodiment

Figure 27:
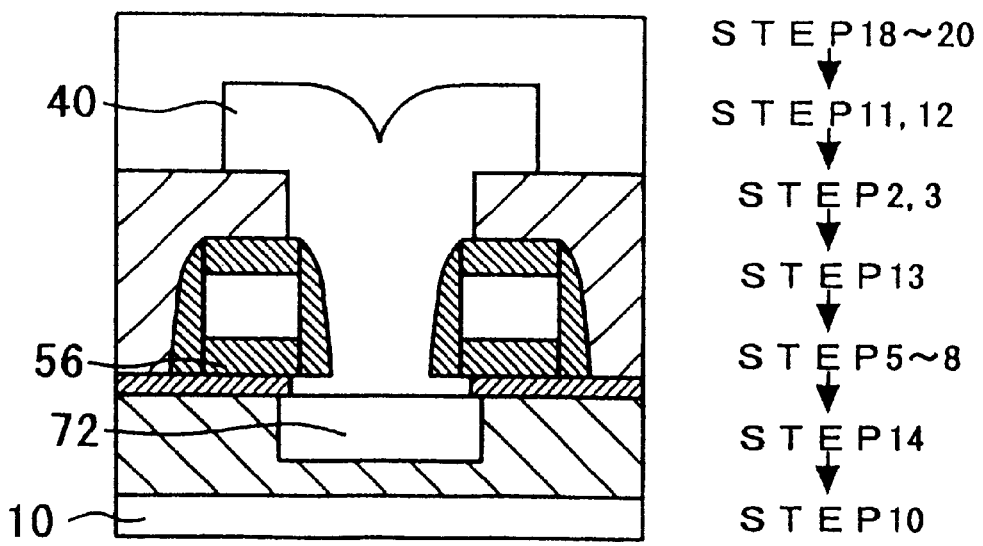
FIG. 27 is a cross-sectional view showing a principal part of a semiconductor device practiced as a ninth embodiment of the present invention.

A ninth embodiment of this invention will now be described with reference to FIG. 27. In FIG. 27, those parts with their counterparts already shown in FIGS. 1 through 26 are given the same reference numerals, and descriptions of such parts are omitted partially or entirely where they are repetitive.

FIG. 27 is a cross-sectional view of a semiconductor device practiced as the ninth embodiment of the invention. As with the fifth embodiment (see FIG. 20), the semiconductor device of the ninth embodiment has the wiring 72 interposed between the contacts 44 and the silicon substrate 10. Except for the presence of the wiring 72, the semiconductor device of the ninth embodiment has the same structure as the second embodiment (see FIG. 8).

The above structure allows the ninth embodiment to extend the bottom regions of the contacts 44 into beneath of the nitride film bottom walls 56. This means that semiconductor device of the ninth embodiment may have an even lower level of contact resistance between the contacts 44 and the wiring 72 than the fifth embodiment. The ninth embodiment may be manufactured by carrying out the above-described steps 18 through 20, 11, 12, 2, 3, 13, 5 through 8, 14, and 10, in that order.

Tenth Embodiment

Figure 28:
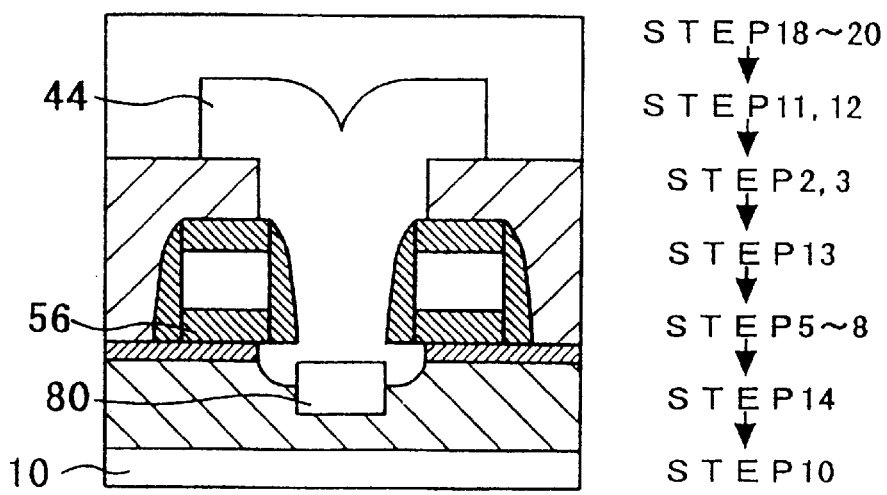
FIG. 28 is a cross-sectional view showing a principal part of a semiconductor device practiced as a tenth embodiment of the present invention.
Figure 29:
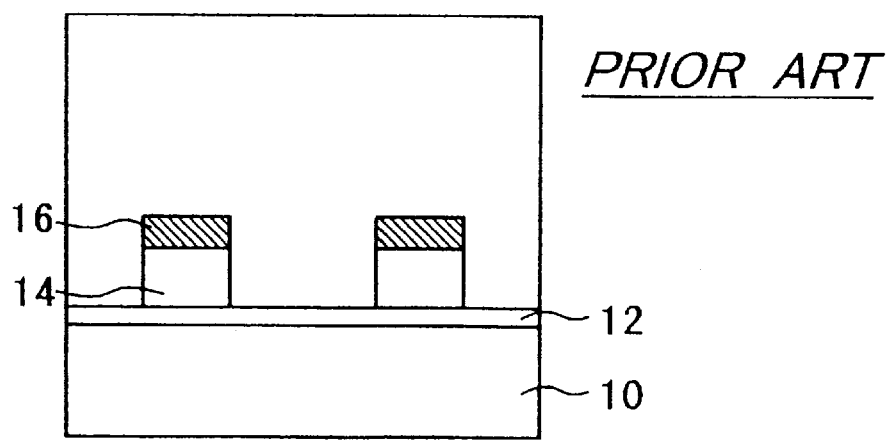
FIGS. 29 and 30 are cross sectional views of conventional semiconductor device for explaining a method for manufacturing the same.
Figure 30:
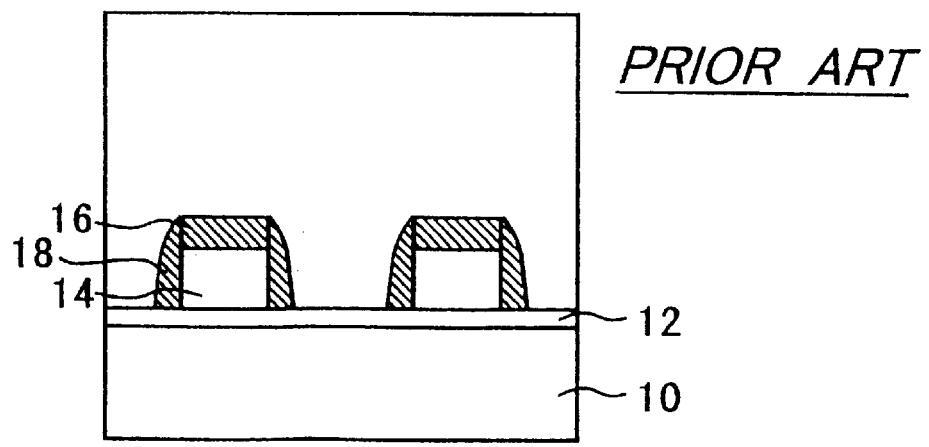
Figure 31:
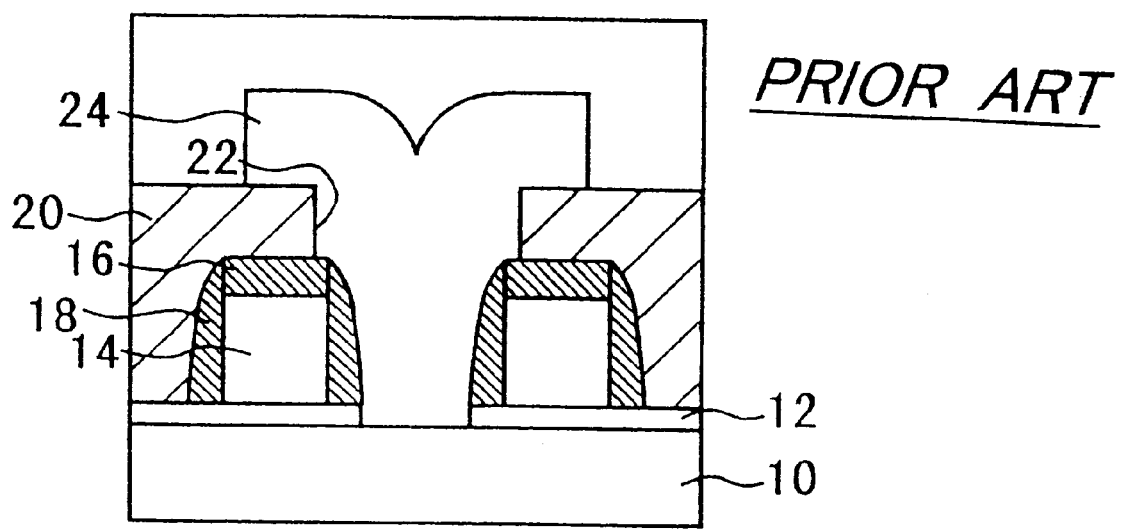
FIG. 31 is a cross sectional view showing a principle part of the conventional semiconductor device.

A tenth embodiment of this invention will now be described with reference to FIG. 28. In FIG. 28, those parts with their counterparts already shown in FIGS. 1 through 27 are given the same reference numerals, and descriptions of such parts are omitted partially or entirely where they are repetitive.

FIG. 28 is a cross-sectional view of a semiconductor device practiced as the tenth embodiment of the invention. As with the sixth embodiment (see FIG. 24), the semiconductor device of the tenth embodiment has thin wiring 80 interposed between the contacts 44 and the silicon substrate 10. Except for the presence of the wiring 80, the semiconductor device of the tenth embodiment has the same structure as the second embodiment (see FIG. 8).

The above structure allows the tenth embodiment to extend the bottom regions of the contacts 44 into beneath of the nitride film bottom walls 56. This means that semiconductor device of the tenth embodiment may have an even lower level of contact resistance between the contacts 44 and the wiring 80 than the sixth embodiment. Except for the need to reduce the wiring width, the semiconductor device of the tenth embodiment may be fabricated by the same steps as the ninth embodiment.

In each of the embodiments described above, the contact holes 42 are furnished between the wiring 34, and the column-like contacts 44 are formed inside the contact holes 42. However, the present invention is not limited to the arrangement. Alternatively, the contact holes 42 may be replaced by grooves. Inside these grooves, the contacts 44 may be replaced by wiring which has a low level of contact resistance and which may be in contact with the silicon substrate 10.

The major benefits of the present invention described above are summarized as follows:

As a first benefit of the invention, the wiring patterns of the semiconductor device are protected by the nitride film top walls and nitride film side walls. This feature allows the contacts of the semiconductor device to be manufactured through self-alignment. Because the contacts protrude into beneath of the nitride film side walls by the amount in which the oxide film is retracted into the walls, it is possible for the inventive semiconductor device to secure a significantly large area of contact edges in order to reduce contact resistance of these contacts.

As a second benefit of the invention, the top of the oxide film provided beneath of the wiring patterns may be formed to be higher than the bottom of the nitride film side walls. Thus whereas the side edge surfaces of the oxide film are formed in a retracted fashion away from the frontal edges of the nitride film side, the oxide film is allowed to remain unfailingly between the wiring patterns and the contacts thereby preventing short-circuits therebetween.

As a third benefit of the invention, the side edge surfaces of the oxide film may be located at beneath of the nitride film side walls. The oxide film and the nitride film side walls isolate the wiring patterns reliably from the contacts, thus securely preventing short-circuits therebetween.

As a fourth benefit of the invention, the nitride film bottom walls may be formed at the bottom of the wiring patterns. That is, the wiring patterns are surrounded by the nitride films. Thus whereas the side edge surfaces of the oxide film are manufactured in a retracted fashion away from the frontal edges of the nitride film side walls, the nitride film bottom walls isolate the wiring patterns from the contacts thereby securely preventing short-circuits therebetween.

As a fifth benefit of the invention, the presence of the nitride film bottom walls reliably prevents short-circuits between the wiring patterns and the contacts even where the side edge surfaces of the oxide film are further retracted away from the back edges of the nitride film side walls. This arrangement sufficiently reduces contact resistance of the contacts because the side edge surfaces of the oxide film regions are further retracted away from the back sides of the nitride film side walls, i.e., because the side edge surfaces of the oxide film are located beneath of the nitride film bottom walls.

Further, the present invention is not limited to these embodiments, but variations and modifications may be made without departing from the scope of the present invention.

What is claimed is:

1. A semiconductor device comprising:
   wiring patterns;
   nitride film top walls formed on top of said wiring patterns;
   nitride film side walls formed laterally to each of said wiring patterns;
   contacts which are each formed interposingly between said wiring patterns and which are isolated from said wiring patterns by said nitride film top walls and said nitride film side walls; and
   an oxide film formed under said wiring patterns, a bottom of the oxide film being lower than that of said nitride film side walls;
   wherein a side edge surface of each of said oxide film is retracted away from a frontal edge of an adjacent nitride film side wall into the corresponding wiring patterns; and
   wherein each of said contacts extends into beneath of the corresponding nitride film side wall.

2. The semiconductor device according to claim 1, wherein, under said wiring patterns, the top of said oxide film is formed to be higher than the bottom of said nitride film side walls.

3. The semiconductor device according to claim 2, wherein the side edge surfaces of said oxide film are located beneath of said nitride film side walls.

4. The semiconductor device according to claim 1, further comprising nitride film bottom walls each formed interposingly between the corresponding wiring pattern and said oxide film and provided between two of said nitride film side walls.

5. The semiconductor device according to claim 4, wherein the side edge surfaces of said oxide film are located beneath of said nitride film bottom walls.

6. The semiconductor device according to claim 1, wherein the said oxide film is retracted away from the frontal edge by at least one third of a thickness of a bottom part of the nitride film side wall.

* * * * *